United States Patent
Strasbaugh et al.

(10) Patent No.: US 6,866,564 B2
(45) Date of Patent: Mar. 15, 2005

(54) METHOD OF BACKGRINDING WAFERS WHILE LEAVING BACKGRINDING TAPE ON A CHUCK

(75) Inventors: Alan Strasbaugh, San Luis Obispo, CA (US); Salman M. Kassir, San Luis Obispo, CA (US)

(73) Assignee: Strasbaugh, San Luis Obispo, CA (US)

( * ) Notice: Subject to any disclaimer, the term of this patent is extended or adjusted under 35 U.S.C. 154(b) by 52 days.

(21) Appl. No.: 10/315,746

(22) Filed: Dec. 10, 2002

(65) Prior Publication Data

US 2003/0134578 A1 Jul. 17, 2003

Related U.S. Application Data

(63) Continuation of application No. 10/259,536, filed on Sep. 26, 2002, now Pat. No. 6,638,389, which is a continuation-in-part of application No. 09/675,747, filed on Sep. 27, 2000, now abandoned.

(51) Int. Cl.[7] ................................................. B24B 1/00
(52) U.S. Cl. ........................................... 451/41; 451/63
(58) Field of Search ................................. 156/153, 154, 156/381, 382, 285, 286, 297, 299, 230, 580, DIG. 37, 538, 543, 552, 556; 438/460, 464, 113, 458; 451/36, 41, 63

(56) References Cited

U.S. PATENT DOCUMENTS

| | | | | |
|---|---|---|---|---|
| 5,273,615 A | * | 12/1993 | Asetta et al. | 156/584 |
| 5,476,566 A | | 12/1995 | Cavasin | 156/249 |
| 5,645,474 A | | 7/1997 | Kubo et al. | 451/287 |
| 5,720,849 A | * | 2/1998 | Yokosuka et al. | 156/571 |
| 5,951,374 A | | 9/1999 | Kato et al. | 451/41 |
| 5,964,646 A | | 10/1999 | Kassir et al. | 451/41 |
| 6,077,149 A | | 6/2000 | Ohkuni et al. | 451/41 |
| 6,112,740 A | | 9/2000 | Wark et al. | 125/35 |
| 6,120,360 A | | 9/2000 | Ball et al. | 451/65 |
| 6,273,791 B1 | | 8/2001 | Kataoka et al. | 451/41 |
| 6,612,915 B1 | * | 9/2003 | Uzoh et al. | 451/285 |

FOREIGN PATENT DOCUMENTS

| JP | 405305560 A | * | 11/1993 |
|---|---|---|---|
| JP | 406302569 A | * | 10/1994 |

* cited by examiner

Primary Examiner—Timothy V. Eley
(74) Attorney, Agent, or Firm—K. David Crockett, Esq.; Crockett & Crockett

(57) ABSTRACT

A method of backgrinding wafers wherein backgrinding tape or a pad is applied to the chuck and not to the wafers. The backgrinding tape or pad is left on the chuck as each wafer is sequentially placed on the tape or pad, background, and then removed from the tape. A tool for applying tape to a chuck, as described herein, facilitates this method.

40 Claims, 4 Drawing Sheets

METHOD OF BACKGRINDING WAFERS WHILE LEAVING BACKGRINDING TAPE ON A CHUCK

This application is a continuation of U.S. application Ser. No. 10/259,536, filed Sep. 26, 2002, now U.S. Pat. No. 6,638,389, which is a continuation-in-part of U.S. application Ser. No. 09/675,747, filed Sep. 27, 2000, now abandoned.

FIELD OF THE INVENTION

The present invention is in the field of semiconductor manufacturing and it specifically relates to devices and methods for protecting the front side of device wafers during backgrinding, grinding, polishing, or chemical mechanical planarizing of very thin and frangible wafers.

BACKGROUND OF THE INVENTION

As described in U.S. Pat. No. 5,476,566 issued Dec. 19, 1995 to Cavasin, semiconductor wafers are typically sawn to approximately a 30 mil (0.76 millimeter) thickness as they are being manufactured. Thereafter, electronic circuitry is formed on one side of the wafer, called the front or active side. The front side of the wafer is planarized at various stages of electronic circuit formation, usually by a process known as chemical mechanical planarization (CMP). The wafers may then be thinned in subsequent processing by a backgrinding process wherein the backside, i.e., the side not covered by circuit components, is ground until the wafer is of a reduced thickness, typically on the order of 14 mils (0.36 millimeter).

Advances in device packaging have led to a demand for very thin wafers, on the order of 8 mil (0.20 millimeter) in thickness.

Unfortunately, the ongoing demand for thinner wafers has been accompanied by an ongoing demand for larger-diameter wafers. Wafers having a nominal diameter of 8.0 inches (actually 200 millimeters) are replacing wafers nominally 6.0 inches (actually 150 millimeters) in diameter. As a result of these converging trends, breakage of the wafers during processing has become a serious problem. If the breakage occurs after a number of process steps have been performed on the wafer, the result can be costly, thereby undermining the benefits gained by using larger diameter wafers. Thus, the forces applied to the wafers in the backgrinding process must be applied uniformly across the wafer to minimize breakage.

The problem is further aggravated by the delicate nature of the circuitry built up on the active front surface of the wafer, which ideally should not be scratched by sliding under the pressure applied by a chuck during the backgrinding process. To protect the wafer against this eventuality, it is known in the art (U.S. Pat. No. 5,476,566) to apply an adhesive tape to the front surface of the wafer to protect the circuitry while the backside of the wafer is being ground to achieve a reduced thickness.

In U.S. Pat. No. 5,964,646 issued Oct. 12, 1999 to Kassir et al. there is described the advantageous use of a resilient pad between the wafer and the chuck that supports the wafer during the grinding process. The use of the resilient pad is found to improve the flatness of the ground surface.

The present invention builds on this earlier work by providing a tool that facilitates installing a resilient tape on the chuck, rather than on the front side of the wafer. This permits the resilient tape to remain in place while a number of wafers are ground, polished, or planarized in succession, and this is much more efficient than the prior art technique of applying a resilient tape to each wafer.

Several circumstances complicate the apparently simple operation of applying an adhesive tape to the chuck that is used to hold the wafer during grinding, polishing, or planarization.

First, a widely used type of chuck is composed of an open cell porous ceramic, which allows the wafer to be held against the chuck by a vacuum applied through the ceramic material. As grinding progresses, grinding dust tends to be pulled into the pores of the ceramic chuck. These dust particles can come into contact with the device side of subsequent wafers, causing damage. Therefore, to protect wafers later processed on the same chuck, the dust is usually removed from the chuck after each wafer has been ground. The dust is typically removed by backflushing, whereby water is forced through the porous ceramic chuck in a direction opposite the vacuum airflow. Backflushing would tend to remove the tape from the chuck, but if the adhesion of the tape were great enough to withstand the water pressure, then backflushing could not take place.

A second problem encountered in applying a tape to the chuck is that the tape would tend to seal the ceramic material, defeating the vacuum that is relied on for holding the wafer to the chuck.

A third problem that the present inventors needed to solve was preventing air from becoming trapped between the tape and the chuck. Air bubbles trapped between the tape and the chuck caused the tape to be not completely flush against the chuck, and so the tape was not uniformly flat. Thus, the wafer resting on the tape would be more prone to defects after backgrinding, polishing, or CMP processes were performed.

SUMMARY OF THE INVENTION

The approach taken by the present inventors is to replace the porous ceramic chuck with a solid chuck having passages through it to permit the vacuum to be applied to the wafer. They then use a tape having apertures that register with the ends of the passages at the face of the chuck. Finally, to prevent air from being trapped between the tape and the solid chuck, the tape is applied to the chuck in a vacuum. To facilitate applying the tape to the chuck, the inventors developed a specialized tool that permits the operation to be accomplished swiftly and flawlessly.

In accordance with a preferred embodiment of the invention, a removable vacuum chamber fits over and sealingly engages the chuck. The removable vacuum chamber is indexed to the chuck by means of locating pins. Within the removable vacuum chamber a stamp is provided that is movable in a direction perpendicular to the face of the chuck. The tape to be applied is indexed to the face of the stamp, and then the stamp is advanced toward the chuck to bring the tape into adhesive contact with the face of the chuck. The absence of air within the chamber eliminates the possibility of air being trapped between the tape and the face of the chuck. After the tape has been applied to the chuck, the stamp is retracted, the vacuum within the chamber is relieved, and the chamber is removed from the chuck, leaving the chuck ready to receive a disc.

The novel features which are believed to be characteristic of the invention, both as to its structure and method of operation, together with further objects and advantages thereof, will be better understood from the following description considered in connection with the accompanying drawings in which several embodiments of the invention are illustrated by way of example. It is to be expressly understood, however, that the drawings are for the purpose of illustration and description only and are not intended as a definition of the limits of the invention.

DETAILED DESCRIPTION OF THE PREFERRED EMBODIMENTS

Figure 1:
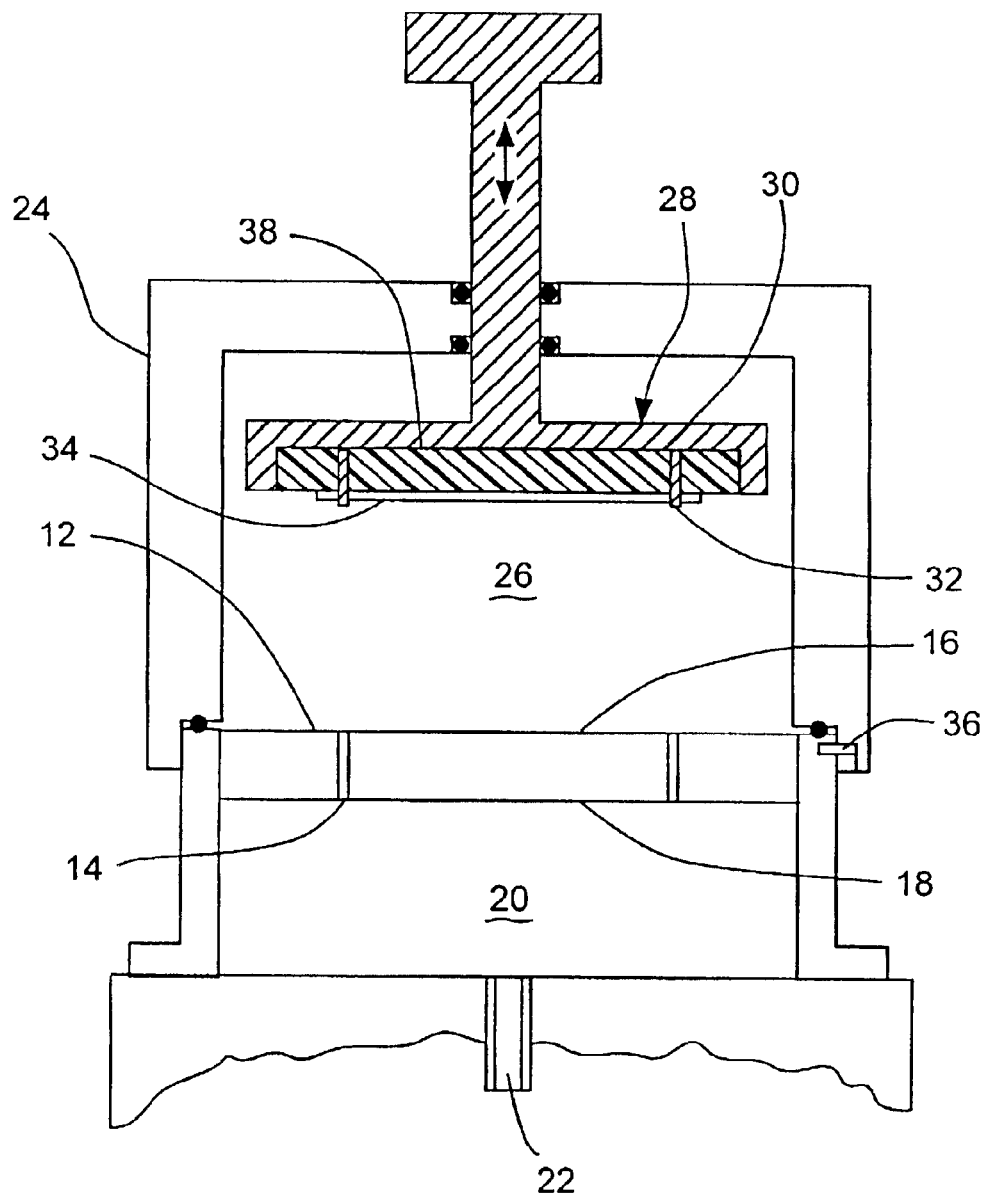
FIG. 1 shows a first preferred embodiment of the tool of the present invention.

FIG. 1 shows a first preferred embodiment of the tool of the present invention. The chuck 12 is composed of a non-porous rigid material such as a non-porous ceramic. The chuck is provided with a number of passages, of which the passage 14 is typical, that extend completely through the chuck and that are manifest as holes in the face 16 of the chuck. When a wafer is being backgrounded, the front surface of the wafer faces the face 16 of the chuck. On the opposite side 18 of the chuck is a chamber 20 that can be selectively evacuated by connecting a vacuum pump to the port 22.

In accordance with the present invention, a tool is used for applying an insert 34 to the face 16 of the chuck. The insert 34 may comprise tape, a pad, a disk, or other device suitable for supporting a wafer on the chuck or wafer carrier. The insert may have an adhesive on one side, both sides, or neither side. The insert may be porous or may be provided with one or more holes so that a vacuum may communicate from the vacuum chamber 20, through the chuck, through the insert, and to the wafer.

In a preferred embodiment, the tool includes a removable housing 24 that, when placed over the chuck in sealing engagement forms a closed chamber 26 that is evacuated when a vacuum pump is connected to the port 22; air initially within the chamber 26 is drawn through the passages 14 into the chamber 20 and out through the port 22.

Within the chamber 26, a stamp 28 faces the face 16 of the chuck. The stamp 28 includes a planar face 30 that is maintained parallel to the planar face 16 of the chuck as the stamp is advanced toward the chuck. At least two locating pins, of which the pin 32 is typical, protrude from the face 30. These pins are used as follows.

At the beginning of the procedure, before the removable housing 24 is placed over the chuck 12, the tape 34 which is to be attached to the face 16 of the chuck is precut to the desired size and shape, including an array of holes that are spaced to register with the passages 14 of the chuck. The precut tape 34 is manually placed on the face 30 of the stamp, and the tape 34 is indexed to the stamp by shifting the tape until the locating pins 32 extend through certain holes in the tape. The side of the tape that faces the chuck bears an adhesive coating. Once this has been done, the removable housing 24 is placed over the chuck 12.

One or more locating pins, of which the pin 36 is typical, index the removable housing 24 with respect to the chuck 12. A vacuum is then applied at the port 22, and after the chambers 20 and 26 are sufficiently evacuated, the stamp 28 is advanced toward the chuck 12. As the face 30 closely approaches the face 16 of the chuck, the locating pins 32 advance into the passages 14, thereby improving the accuracy with which the holes in the tape 34 register with the passages 14 of the chuck.

The adhesive coating on the exposed side of the tape or insert 34 adheres the tape or insert to the face 16 of the chuck. The lack of air in the chamber prevents air from being trapped between the tape or insert and the face of the chuck.

A number of possibilities exist for the design of the stamp and there are a number of ways of moving it toward the chuck. For example, in the preferred embodiment the face 30 of the stamp includes a layer 38 of a resilient material (through which the locating pins 32 extend) to assure a uniform distribution of pressure when the film is pressed against the face 16 of the chuck. In one alternative embodiment, a weaker adhesive on the side of the tape facing the stamp suffices to retain the tape on the stamp before the tape makes contact with the face 16. Any traces of this weak adhesive remaining on the tape after the tape has been applied to the chuck may be removed by a suitable solvent.

In another alternative embodiment, the tape is drawn against the stamp by a vacuum applied through the stamp. This can be done by using either a porous stamp or a non-porous stamp having passages through it, analogous to the manner in which the chuck 12 retains a wafer, Clearly, the pressure in the chamber 26 must be controlled to be slightly greater than the pressure at the face 30 of the stamp, until the tape has made contact with the chuck. Thereafter, a slight overpressure may be applied through the stamp to overcome any tendency of the tape to cling to the face of the stamp.

Consistent with the present invention, any of several techniques may be used to advance the stamp. In the preferred embodiment of FIG. 1, the stamp is pushed manually into the housing 24. In alternative embodiments, the integrity of the removable housing is not disturbed, and the moving mechanism is located entirely within the chamber 26.

Figure 2:
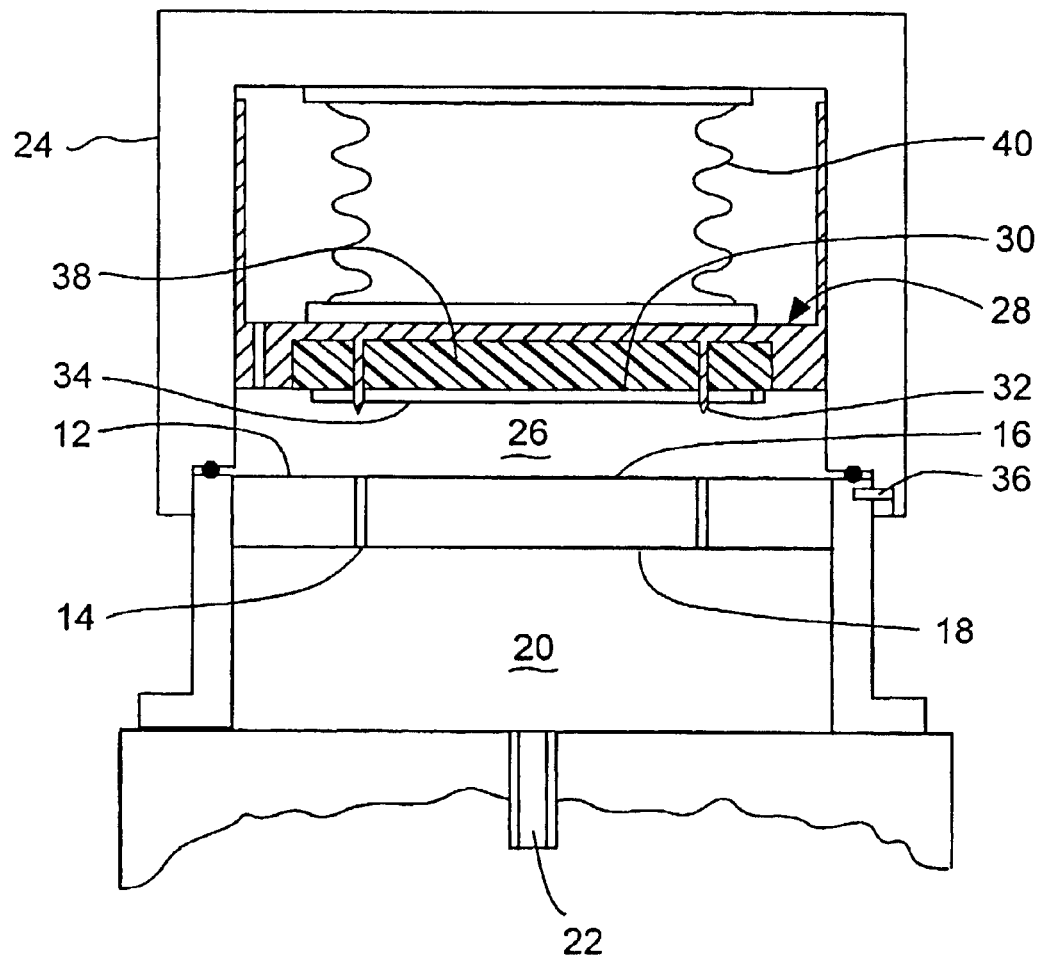
FIG. 2 shows an alternative embodiment of the present invention.

For example, in the alternative embodiment shown in FIG. 2, an air-filled bellows 40 located above the stamp expands as the vacuum is applied to the port 22, so as to push the stamp toward the chuck. When the vacuum is relieved, the bellows returns to its original smaller size. The action of the bellows repeats automatically each time the vacuum is applied, and the use of the bellows eliminates the need for electrical or vacuum feed-through on the housing 24. In still other embodiments, the stamp could be driven by an electrical solenoid or motor.

Figure 3:
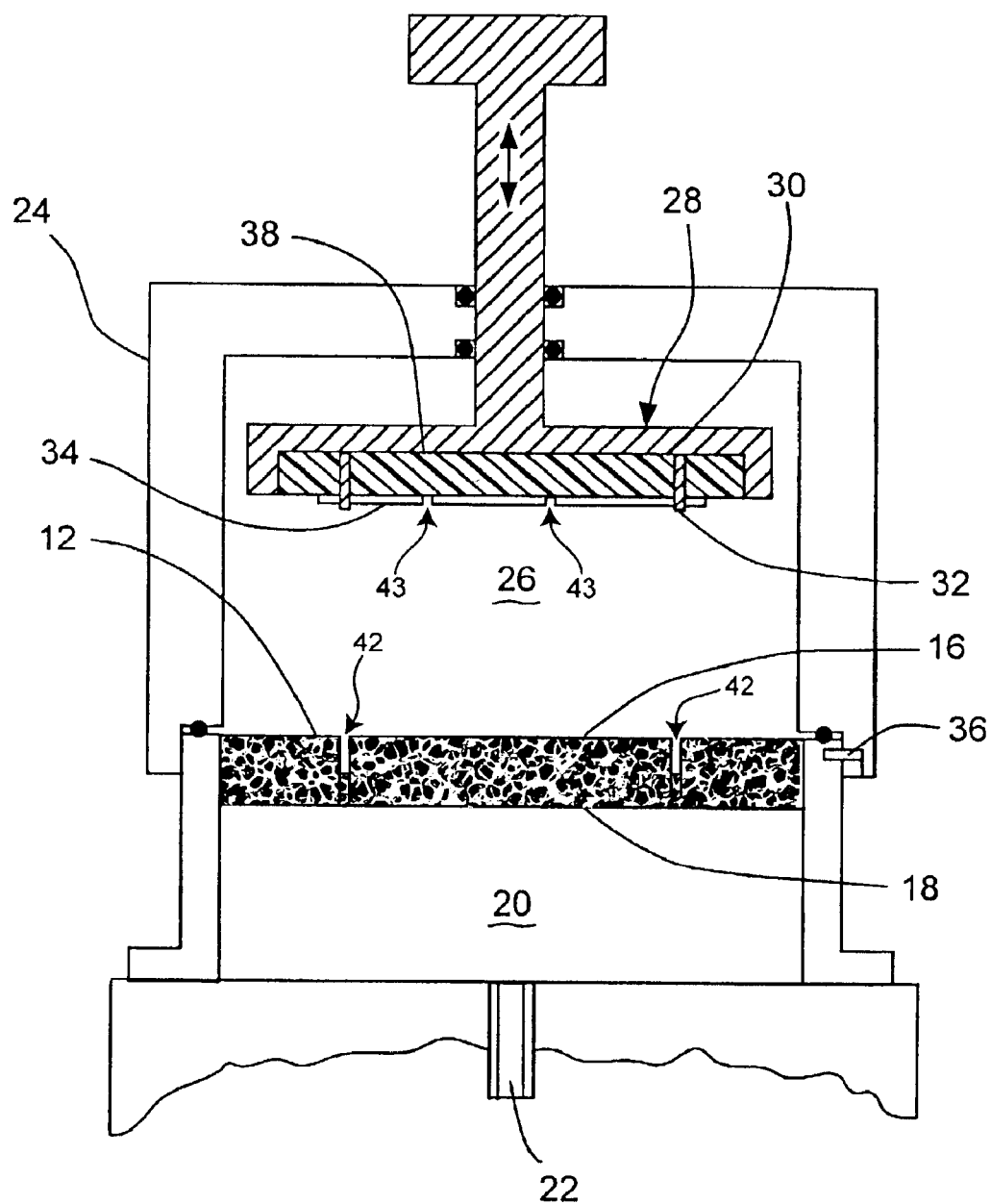
FIG. 3 illustrates a chuck provided with blind registration holes and a tool for applying tape to the chuck.

FIG. 3 illustrates a chuck provided with blind registration holes and a tool for applying tape to the chuck. The chuck in this embodiment is porous. A number of blind holes 42 are provided in the top of the chuck, and some or all of these holes are located to correspond to registration pins protruding from the stamping surface of the stamp. The tape is provided with corresponding holes, located such that placing the tape on the stamp with the registration pins protruding through the holes in the tape, and thereafter lowering the stamp so that the registration pins enter corresponding blind holes, properly locates the tape relative to the chuck. The registration pins are sized and dimension to fit within the blind holes of the chuck and permit the stamping face and tape assembly to move into contact with the chuck. When the tape is applied to the chuck, numerous holes in the tape align with numerous holes in the chuck. Thus, registration is achieved as described relative to the previous figures, and the porous chuck can be back-flushed. Thereafter, a wafer can be placed on the tape and secured to the tape by suction applied through the chuck (with a vacuum applied to the bottom of the chuck acting on the wafer through the pores and blind holes of the chuck). Fluid used for backflushing passes partly through the blind holes, and relieves pressure that might otherwise push and lift the tape away from the chuck.

Figure 4:
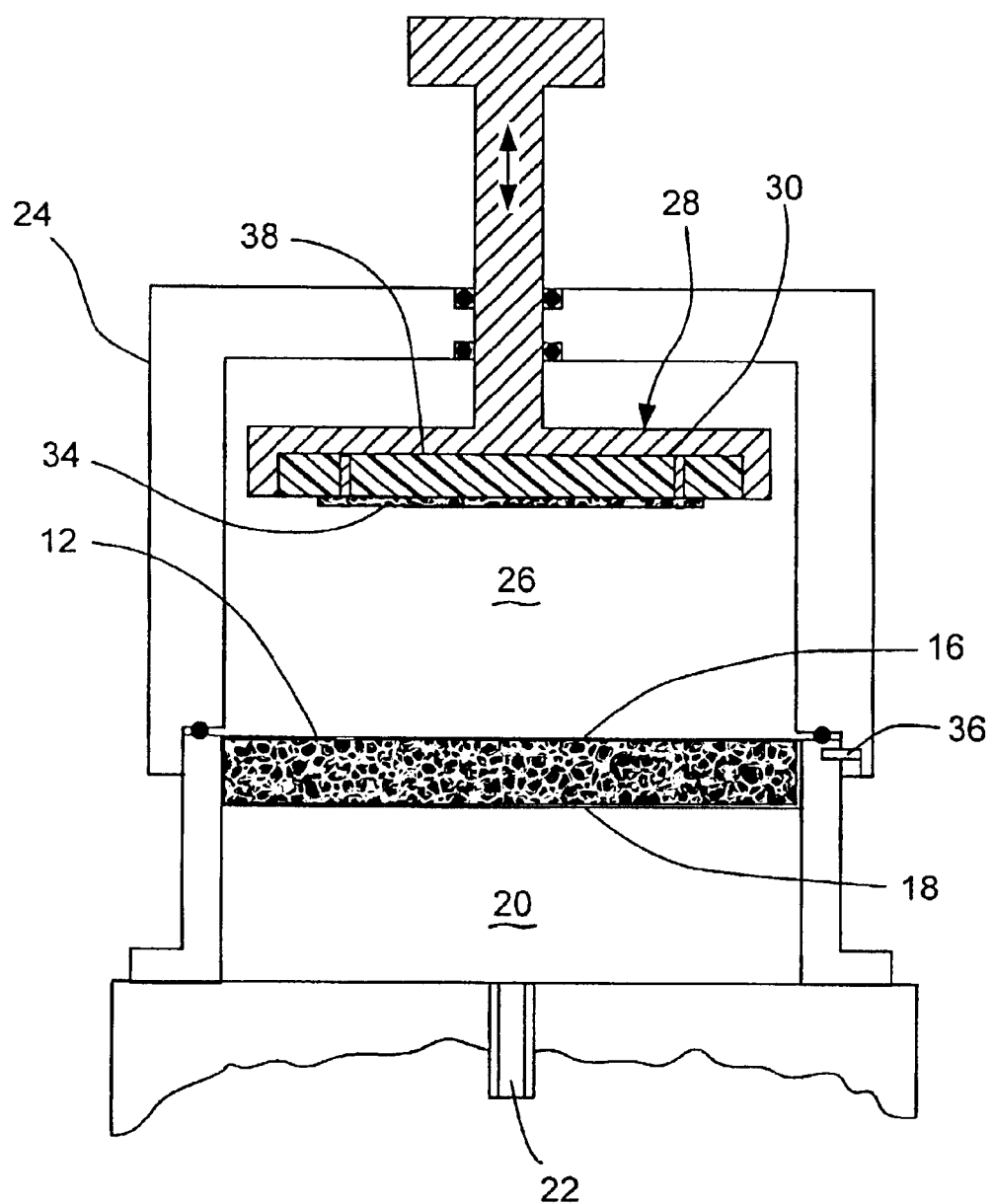
FIG. 4 illustrates a porous chuck and a tool for applying porous tape to the chuck.

FIG. 4 illustrates a porous chuck and a tool for applying porous tape to the chuck. The chuck is porous, or provided with a multitude of through holes. The tape is also highly porous, comprised of a reticulated foam (such that air may pass from one side to the other through the tape), or provided with a multitude of through holes. The number and size of pores or through holes are chosen such that, regardless of the position of the tape on the chuck, a sufficient number of pores or holes in the tape overly holes or pores on the chuck. The tape is applied to the chuck after evacuation of the vacuum chamber, as described in relation to the previous figures, and is held to the chuck by the adhesive on the chuck side of the tape. Thereafter, a wafer can be placed on the tape and secured to the tape by suction applied through the chuck (with a vacuum applied to the bottom of the chuck).

In another alternative embodiment the chuck is removed from the backgrinding or CMP machine and may be inverted to form the upper end of the chamber 26. Gravity may then be relied on to keep the tape on the face 30 of the stamp prior to contact of the tape with the face 16 of the chuck.

Thus, there has been described a tool for applying an adhesive-coated tape to the face of a chuck that is used to hold a wafer during grinding, polishing, or CMP operations. The application of an adhesive-coated resilient tape to the face of the chuck is particularly helpful when backgrinding of the wafer is performed, in that the resiliency of the tape prevents the unyielding face of the chuck from damaging the frangible electronic components on the front side of the wafer.

In use, the tool is used to apply an insert to the face of a chuck. A vacuum supplied through the chuck and the insert holds the wafer during one or more methods of grinding or polishing the back surface of a wafer that has circuitry deposited on the front surface without damaging the circuitry. The wafer may be similarly held during various CMP steps.

One method of grinding or polishing the backside of a wafer comprises the steps of adhering a tape (which may be resilient) to the chuck, placing the wafer onto the chuck such that the front surface of the wafer is facing the tape, and then grinding the back surface of the wafer. The tape protects the front side of the wafer from the chuck. A method of performing CMP comprises the steps of adhering a tape to the chuck, placing the wafer onto the chuck, and then performing CMP on the wafer. The tape protects the side of the wafer facing the chuck.

The chuck face may be provided with a pattern of holes and the resilient tape may be provided with a matching pattern of apertures. In this case, an additional initial step may be added to any of the above methods of grinding, polishing, or planarizing a wafer comprising the additional step of positioning the tape so that the apertures in the tape are in registration with the holes in the face of the chuck.

The foregoing detailed description is illustrative of several embodiments of the invention, and it is to be understood that additional embodiments thereof will be obvious to those skilled in the art. The embodiments described herein together with those additional embodiments are considered to be within the scope of the invention.

We claim:

1. A method of preparing a wafer, said method comprising the steps of:
   a) providing a wafer having a front side and a back side;
   b) processing the wafer such that the wafer has a flatness and a thickness suitable for building-up a device on the front side of the wafer;
   c) building-up a device onto the front side of the wafer;
   d) providing a chuck and a tape, wherein the chuck is suitable for supporting the tape during a backgrinding process, and wherein the tape is suitable for supporting the wafer;
   e) placing the tape onto the chuck;
   f) after placing the tape onto the chuck, placing the front side of the wafer onto the tape;
   g) securing the front side of the wafer to the tape;
   h) grinding the back side of the wafer; and
   i) removing the wafer from the tape.

2. The method of claim 1 comprising the further steps of:
   providing a second wafer having a front side and a back side;
   processing the second wafer such that the second wafer has a flatness and a thickness suitable for building-up a device on the front side of the second wafer;
   building-up a device onto the front side of the second wafer; and
   repeating steps e) through i) on the second wafer while leaving the tape on the chuck.

3. The method of claim 1 wherein the step of removing the wafer from the tape comprises the step of removing the wafer from the tape without removing the tape from the chuck.

4. The method of claim 1 comprising the further steps of:
   providing a second wafer having a front side and a backside, wherein a device is built up on the front side of the second wafer;
   after removing the wafer from the tape, leaving the tape on the chuck and then securing the front side of the second wafer to the tape;
   grinding the back side of the second wafer; and
   removing the second wafer from the tape.

5. The method of claim 4 wherein the step of removing the second wafer from the tape comprises the step of removing the second wafer from the tape without removing the tape from the chuck.

6. The method of claim 1 comprising the further steps of:
   providing a plurality of wafers, wherein each of the plurality of wafers has a front side and a back side and wherein each of the plurality of wafers has a device built-up on the front side;
   sequentially placing on the tape and then removing from the tape the front side of each of the plurality of wafers while leaving the tape on the chuck; and
   grinding the back side of each of the plurality of wafers before removing each of the plurality of wafers from the tape.

7. The method of claim 6 wherein the step of providing a chuck and a tape comprises providing a resilient tape.

8. The method of claim 1 wherein:
   the step of providing a chuck and a tape further comprises providing a chuck capable of communicating a vacuum and providing a tape capable of communicating a vacuum;

the step of securing the front side of the wafer to the tape comprises securing the front side of the wafer to the tape by applying a vacuum through the chuck and the tape; and the step of removing the wafer from the tape further comprises releasing vacuum and then removing the wafer from the tape.

9. The method of claim 8 wherein the step of providing a chuck and a tape further comprises providing a chuck having a face that includes a pattern of holes and providing a tape having a matching pattern of apertures, said method comprising the further steps of:

positioning the tape so that the apertures in the tape are in registration with the holes in the face of the chuck.

10. The method of claim 1 wherein the step of providing a chuck and a tape further comprises providing a resilient tape.

11. A method of preparing a wafer, said method comprising the steps of:

providing a wafer having a front side and a back side;

processing the wafer such that the wafer has a flatness and a thickness suitable for building-up a device on the front side of the wafer;

building-up a device onto the front side of the wafer;

providing a chuck, wherein the chuck is suitable for supporting a tape during a backgrinding process and wherein the chuck is capable of communicating a vacuum;

providing a tape having a wafer side suitable for supporting the wafer and a chuck side suitable for resting on a chuck, wherein the chuck side of the tape is adhesive and the wafer side of the tape is non-adhesive; and wherein the tape is capable of communicating a vacuum;

placing the chuck side of the tape onto the chuck;

thereafter placing the front side of the wafer onto the wafer side of the tape;

securing the front side of the wafer to the wafer side of the tape by applying a vacuum through the chuck and the tape;

grinding the back side of the wafer;

releasing the vacuum; and removing the wafer from the tape.

12. The method of claim 11 comprising the further steps of:

providing a second wafer having a front side and a backside, wherein a device is built up on the front side of the second wafer;

after removing the wafer from the tape, leaving the tape on the chuck and then securing the front side of the second wafer to the tape by reapplying the vacuum through the chuck and tape;

grinding the back side of the second wafer;

releasing the vacuum; and removing the second wafer from the tape.

13. The method of claim 12 wherein the step of removing the second wafer from the tape comprises the step of removing the second wafer from the tape without removing the tape from the chuck.

14. The method of claim 13 wherein the step of providing a tape further comprises providing a resilient tape.

15. The method of claim 11 comprising the further steps of:

providing a plurality of wafers, wherein each of the plurality of wafers has a front side and a back side and wherein each of the plurality of wafers has a device built-up on the front side;

sequentially placing on the tape and then removing from the tape the front side of each of the plurality of wafers while leaving the tape on the chuck; and grinding the back side of each of the plurality of wafers before removing each of the plurality of wafers from the tape.

16. The method of claim 11 wherein the step of removing the wafer from the tape comprises the step of removing the wafer from the tape without removing the tape from the chuck.

17. The method of claim 11 wherein the step of providing a tape further comprises providing a resilient tape.

18. The method of claim 11 comprising the further step of adhering the front side of the wafer to the tape with a weak adhesive.

19. The method of claim 11 wherein the step of providing a chuck and a tape further comprises providing a chuck having a face that includes a pattern of holes and providing a tape having a matching pattern of apertures, said method comprising the further steps of:

positioning the tape so that the apertures in the tape are in registration with the holes in the face of the chuck.

20. The method of claim 11 wherein the step of providing a tape further comprises providing a resilient tape and wherein the method comprises the further step of adhering the front side of the wafer to the tape with a weak adhesive.

21. A method of preparing a wafer, said method comprising the steps of:

a) providing a wafer having a front side and a back side;

b) processing the wafer such that the wafer has a flatness and a thickness suitable for building-up a device on the front side of the wafer;

c) building-up a device onto the front side of the wafer;

d) providing a chuck and a pad, wherein the chuck is suitable for supporting the pad during a backgrinding process, and wherein the pad is suitable for supporting the wafer;

e) placing the pad onto the chuck;

f) after placing the pad onto the chuck, placing the front side of the wafer onto the pad;

g) securing the front side of the wafer to the pad;

h) grinding the back side of the wafer; and i) removing the wafer from the pad.

22. The method of claim 21 comprising the further steps of:

providing a second wafer having a front side and a back side;

processing the second wafer such that the second wafer has a flatness and a thickness suitable for building-up a device on the front side of the second wafer;

building-up a device onto the front side of the second wafer; and repeating steps e) through i) on the second wafer while leaving the pad on the chuck.

23. The method of claim 21 wherein the step of removing the wafer from the pad comprises the step of removing the wafer from the pad without removing the pad from the chuck.

24. The method of claim 21 comprising the further steps of:

providing a second wafer having a front side and a back side, wherein a device is built up on the front side of the second wafer;

after removing the wafer from the pad, leaving the pad on the chuck and then securing the front side of the second wafer to the pad;

grinding the back side of the second wafer; and removing the second wafer from the pad.

25. The method of claim 24 wherein the step of removing the second wafer from the pad comprises the step of removing the second wafer from the pad without removing the pad from the chuck.

26. The method of claim 21 comprising the further steps of:

providing a plurality of wafers, wherein each of the plurality of wafers has a front side and a back side and wherein each of the plurality of wafers has a device built-up on the front side;

sequentially placing on the pad and then removing from the pad the front side of each of the plurality of wafers while leaving the pad on the chuck; and grinding the back side of each of the plurality of wafers before removing each of the plurality of wafers from the pad.

27. The method of claim 26 wherein the step of providing a chuck and a pad comprises providing a resilient pad.

28. The method of claim 21 wherein:

the step of providing a chuck and a pad further comprises providing a chuck capable of communicating a vacuum and providing a pad capable of communicating a vacuum;

the step of securing the front side of the wafer to the pad comprises securing the front side of the wafer to the pad by applying a vacuum through the chuck and the pad; and the step of removing the wafer from the pad further comprises releasing vacuum and then removing the wafer from the pad.

29. The method of claim 28 wherein the step of providing a chuck and a pad further comprises providing a chuck having a face that includes a pattern of holes and providing a pad having a matching pattern of apertures, said method comprising the further steps of:

positioning the pad so that the apertures in the pad are in registration with the holes in the face of the chuck.

30. The method of claim 21 wherein the step of providing a chuck and a pad further comprises providing a resilient pad.

31. A method of preparing a wafer, said method comprising the steps of:

providing a wafer having a front side and a back side;

processing the wafer such that the wafer has a flatness and a thickness suitable for building-up a device on the front side of the wafer;

building-up a device onto the front side of the wafer;

providing a chuck, wherein the chuck is suitable for supporting a pad during a backgrinding process and wherein the chuck is capable of communicating a vacuum;

providing a pad having a wafer side suitable for supporting the wafer and a chuck side suitable for resting on a chuck, wherein the chuck side of the pad is adhesive and the wafer side of the pad is non-adhesive; and wherein the pad is capable of communicating a vacuum;

placing the chuck side of the pad onto the chuck;

thereafter placing the front side of the wafer onto the wafer side of the pad; securing the front side of the wafer to the wafer side of the pad by applying a vacuum through the chuck and the pad;

grinding the back side of the wafer;

releasing the vacuum; and removing the wafer from the pad.

32. The method of claim 31 wherein the step of providing a pad further comprises providing a resilient pad and wherein the method comprises the further step of adhering the front side of the wafer to the pad with a weak adhesive.

33. The method of claim 31 comprising the further steps of:

providing a second wafer having a front side and a back side, wherein a device is built up on the front side of the second wafer;

after removing the wafer from the pad, leaving the pad on the chuck and then securing the front side of the second wafer to the pad by reapplying the vacuum through the chuck and pad;

grinding the back side of the second wafer;

releasing the vacuum; and removing the second wafer from the pad.

34. The method of claim 33 wherein the step of removing the second wafer from the pad comprises the step of removing the second wafer from the pad without removing the pad from the chuck.

35. The method of claim 34 wherein the step of providing a pad further comprises providing a resilient pad.

36. The method of claim 31 comprising the further steps of:

providing a plurality of wafers, wherein each of the plurality of wafers has a front side and a back side and wherein each of the plurality of wafers has a device built-up on the front side;

sequentially placing on the pad and then removing from the pad the front side of each of the plurality of wafers while leaving the pad on the chuck; and grinding the back side of each of the plurality of wafers before removing each of the plurality of wafers from the pad.

37. The method of claim 31 wherein the step of removing the wafer from the pad comprises the step of removing the wafer from the pad without removing the pad from the chuck.

38. The method of claim 31 wherein the step of providing a pad further comprises providing a resilient pad.

39. The method of claim 31 comprising the further step of adhering the front side of the wafer to the pad with a weak adhesive.

40. The method of claim 31 wherein the step of providing a chuck and a pad further comprises providing a chuck having a face that includes a pattern of holes and providing a pad having a matching pattern of apertures, said method comprising the further steps of:

positioning the pad so that the apertures in the pad are in registration with the holes in the face of the chuck.

* * * * *